United States Patent

Nam

(10) Patent No.: US 9,620,198 B1
(45) Date of Patent: Apr. 11, 2017

(54) WORD LINE DRIVER, SEMICONDUCTOR MEMORY APPARATUS AND TEST METHOD USING THE SAME

(71) Applicant: SK hynix Inc., Gyeonggi-do (KR)

(72) Inventor: Sang Yun Nam, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/010,595

(22) Filed: Jan. 29, 2016

(30) Foreign Application Priority Data

Nov. 6, 2015 (KR) ........................ 10-2015-0155926

(51) Int. Cl.
*G11C 29/00* (2006.01)
*G11C 11/4094* (2006.01)
*G11C 29/12* (2006.01)

(52) U.S. Cl.
CPC .......... *G11C 11/4094* (2013.01); *G11C 29/12* (2013.01); *G11C 2029/1204* (2013.01)

(58) Field of Classification Search
USPC ........................ 365/201, 203, 230.06, 230.04
See application file for complete search history.

(56) References Cited

U.S. PATENT DOCUMENTS

| 5,808,955 A * | 9/1998 | Hwang | G11C 8/14 326/106 |
| 8,274,853 B2 * | 9/2012 | Lee | G11C 29/12005 365/201 |
| 2014/0211577 A1 * | 7/2014 | Ryu | G11C 11/4074 365/189.16 |

FOREIGN PATENT DOCUMENTS

KR 100648280 11/2006

* cited by examiner

*Primary Examiner* — Vu Le
(74) *Attorney, Agent, or Firm* — IP &T Group LLP

(57) ABSTRACT

A semiconductor memory apparatus may precharge a plurality of word lines to first and/or second low voltages. The semiconductor memory apparatus may precharge an odd word line and an even word line to different levels, and accelerate passing GIDL occurring from a memory cell toward a word line to screen memory cells susceptible to GIDL.

20 Claims, 6 Drawing Sheets

WORD LINE DRIVER, SEMICONDUCTOR MEMORY APPARATUS AND TEST METHOD USING THE SAME

CROSS-REFERENCES TO RELATED APPLICATION

The present application claims priority under 35 U.S.C. §119(a) to Korean application number 10-2015-0155926, filed on Nov. 6, 2015, in the Korean Intellectual Property Office, which is incorporated herein by reference in its entirety.

BACKGROUND

1. Technical Field

Various embodiments of the present disclosure generally relate to semiconductor technology and more particularly to a word line driver for a semiconductor device.

2. Related Art

A semiconductor memory device such as a dynamic random access memory (DRAM) includes a plurality of memory cells for storing data. Each memory cell has a metal oxide semiconductor (MOS) transistor and a capacitor and is coupled to a word line and a 20 bit line. With increasing integration degree, it becomes more difficult to secure stable operation of a MOS transistor. Also, as the gate line width becomes smaller due to improved manufacturing processes, the size of a transistor employed in a memory cell also becomes smaller. As a result, the threshold voltage, the current driving ability and the operating speed of the transistor as well as the information storage time margin of the memory cell itself, approach their safe operation limits. In particular, it is now oftentimes difficult to secure the information storage time of a memory cell, due to gate induced drain leakage (GIDL) which occurs in the area between the source and drain region near the gate electrode. That is because, as the size of the transistor is reduced, the GIDL rapidly increases.

Since memory cells susceptible to GIDL reduce the reliability of a semiconductor memory apparatus, memory cells need to be screened at the initial stage of the fabrication process, in order to secure the quality of the semiconductor memory apparatus. Hence, there is an increased demand for a method capable of effectively screening a memory chip for memory cells susceptible GIDL, during fabrication of the memory chip on a wafer.

SUMMARY

Various embodiments of the present disclosure are directed to a word line driver capable of screening memory cells susceptible to GIDL, and a semiconductor memory apparatus and a test method using the same.

In an embodiment of the present disclosure, a word line driver may include: a precharge voltage generator configured to provide a first and/or a second low voltages as a precharge voltage; and a sub word line driver configured to precharge a word line to the precharge voltage. The precharge voltage of the word line is different from the precharge voltage of an adjacent word line adjacent to the word line.

In an embodiment of the present disclosure, a semiconductor memory apparatus may include: a memory cell array comprising an odd word line and an even word line which are alternately arranged; and a word line driver configured to precharge the odd word line to a first and/or a second low voltages, and precharge the even word line to one of the first and second low voltages.

In an embodiment of the present disclosure, a test method 1o of a semiconductor memory apparatus may include: storing first data in a memory cell coupled to an odd word line, and second data in a memory cell coupled to an even word line; and precharging an odd word line to a first low voltage, and an even word line to a second low voltage being different from the first low voltage.

DETAILED DESCRIPTION

Hereinafter, a word line driver for screening gate induced drain leakage (GIDL), a semiconductor memory apparatus and a test method using the same according to the present disclosure will be described below with reference to the accompanying drawings.

Figure 1:
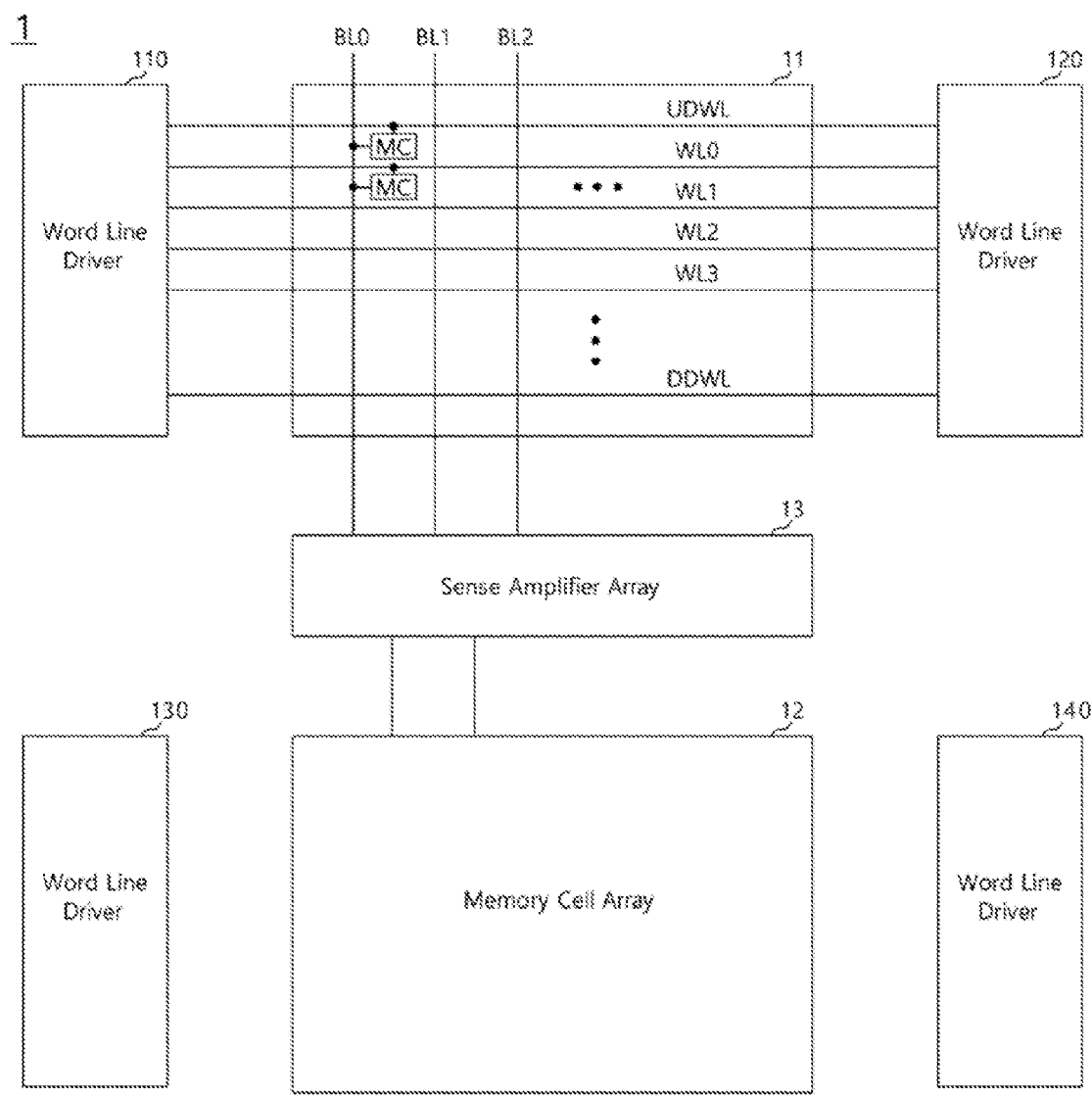
FIG. 1 is a diagram illustrating a semiconductor memory apparatus, according to an embodiment of the present disclosure.

Referring to FIG. 1 a semiconductor memory apparatus 1 according to an embodiment of the present disclosure is provided.

The semiconductor memory apparatus 1 may include a plurality of memory cell arrays 11 and 12, a sense amplifier array 13, and a plurality of word line drivers 110 to 140. The plurality of memory cell arrays 11 and 12 may be included in one memory bank. The memory cell array 11 may include a plurality of word lines WL0 to WL3 and a plurality of bit lines BL0 to BL2 arranged therein. The plurality of word lines WL0 to WL3 may include odd word lines and even word lines. The bit lines BL0 to BL2 may be arranged perpendicular to the plurality of word lines. The bit lines BL0 to BL2 may include odd bit lines and even bit lines. The respective intersections between the plurality of word lines WL0 to WL3 and the plurality of bit lines BL0 to BL2 may be coupled to memory cells MC. The memory cell array 12 may be configured in the same manner as the memory cell array 11.

The sense amplifier array 13 may be coupled to the bit lines of the two adjacent memory cell arrays 11 and 12 in common. The semiconductor memory apparatus 1 may have an open bit line architecture in which the bit lines of the adjacent memory cell arrays 11 and 12 are coupled through the sense amplifier array 13.

The word line drivers 110 and 120 may select one or more of the plurality of word lines WL0 to WL3. The word line drivers 110 and 120 may select a desired word line based on a word line select signal. The word line select signal may be generated from a row decoder (not shown) which decodes a row address signal. The semiconductor memory apparatus 1 may include a column decoder (not shown) for selecting one or more of the plurality of bit lines BL0 s1 to BL2. As illustrated in FIG. 1, the word line drivers 110 and 120 may be divided and arranged at both sides of the memory cell array 11. The word line driver 110 arranged in the left side of the memory cell array 11 may access a first part of the word lines WL0 to WL3, and the word line driver 120 arranged in the right side of the memory cell array 11 may access a second part of the word lines WL0 to WL3. However, it is noted that the positions or configurations of the word line drivers 110 and 120 may differ. For example, the word line drivers may not be divided and may be arranged only in the left or the right side of a memory cell array.

The word line drivers 110 and 120 may enable or precharge one or more of the plurality of word lines WL0 to WL3. The word line drivers 110 and 120 may enable one or more of the plurality of word lines WL0 to WL3 to a high-voltage level. A high voltage may include a pumping voltage generated from a supply voltage of the semiconductor memory apparatus 1. The word line drivers 110 and 120 may precharge one or more of the plurality of word lines WL0 to WL3 to a first and/or second low voltages VBBW0 and VBBW1. The word line drivers 110 and 120 may precharge one or more of the plurality of word lines WL0 to WL3 to a first and/or second low voltages VBBW0 and VBBW1 in response to a voltage control signal. The first and second low voltages VBBW0 and VBBW1 may be different. The second low voltage VBBW1 may be lower than the first low voltage VBBW0.

The word line drivers 110 and 120 may precharge one or more of the plurality of word lines WL0 to WL3 to the first low voltage VBBW0 in a first operation mode. The word line drivers 110 and 120 may precharge one or more of the plurality of word lines WL0 to WL3 to the first and/or second low voltages VBBW0 and VBBW1 in a second operation mode. For example, the word line drivers 110 and 120 may precharge the even word lines WL0 and WL2 arranged at the even-numbered orders to the first low voltage VBBW0, and precharge the odd word lines WL1 and WL3 arranged at the odd-numbered orders to the second low voltage VBBW1.

The second operation mode may correspond to a test operation mode for screening memory cells subject to GIDL. The first operation mode may correspond to a normal mode. The first operation mode may include all operation modes other than the test operation mode. In a normal operation mode, a general operation of the semiconductor memory apparatus 1, such as a read, write, erase, and/or refresh operation, may be performed. The semiconductor memory apparatus 1 may precharge word lines to different voltages depending on the operation mode. In the second operation mode, the semiconductor memory apparatus 1 may precharge the adjacent word lines to different voltages. Thus, a memory cell susceptible to GIDL can be readily distinguished.

The memory cell array 11 may further include an up dummy word line UDWL and a down dummy word line DDWL. The up dummy word line UDWL may be arranged at the top of the memory cell array 11, and the down dummy word line DDWL may be arranged at the bottom of the memory cell array 11. The word line drivers 110 and 120 may precharge the up dummy word line UDWL and the down dummy word line DDWL to the first low voltage VBBW0 in the first operation mode. The word line drivers 110 and 120 may precharge the up dummy word line UDWL and the down dummy word line DDWL to the first and/or second low voltage VBBW0 and VBBW1 in the second operation mode.

For example, the word line drivers 110 and 120 may precharge the down dummy word line DDWL to the second low voltage VBBW1 when precharging the up dummy word line UDWL to the first low voltage VBBW0. Or also as an example, the word line drivers 110 and 120 may precharge the down dummy word line DDWL to the first low voltage VBBW0 when precharging the up dummy word line UDWL to the second low voltage VBBW1. In an embodiment, the word line drivers 110 and 120 may precharge the up dummy word line UDWL to the same voltage level as the odd word lines WL1 and WL3, and precharge the down dummy word line DDWL to the same voltage level as the odd word lines WL0 and WL2.

Figure 2:
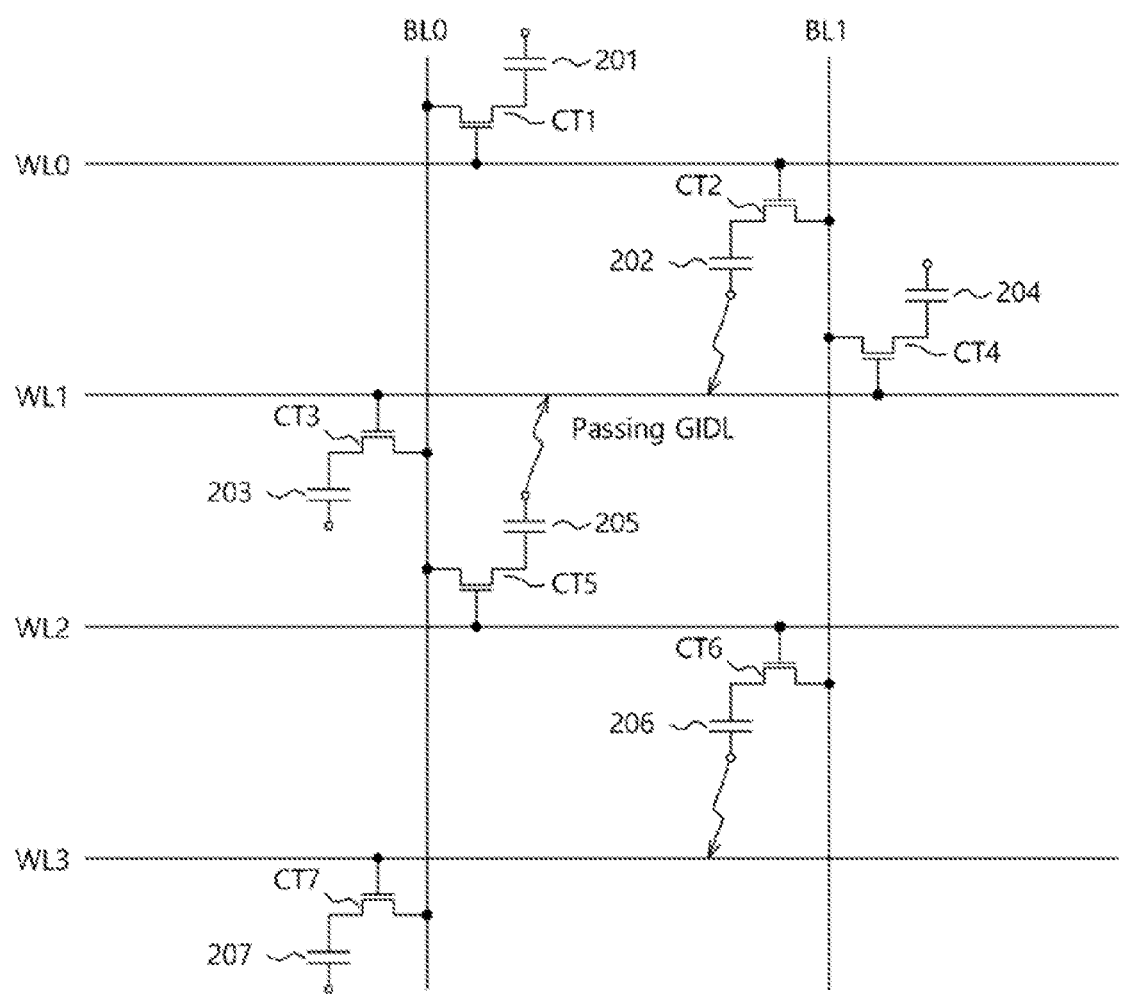
FIG. 2 is a diagram illustrating GIDL.

FIG. 2 is a diagram illustrating gate induced drain leakage (GIDL), which may occur in a semiconductor memory apparatus. Passing GIDL may occur from a memory cell to a word line. For example, the components of FIG. 2 may include partial word lines, partial bit lines, and partial memory cells among the components of the memory cell array 11 of FIG. 1.

Referring to FIG. 2, the first word line WL0 may be coupled to first and second memory cells 201 and 202. The intersection between the first word line WL0 and the first bit line BL0 may be coupled to a first cell transistor CT1 and the first memory cell 201. The intersection between the first word line WL0 and the second bit line BL1 may be coupled to a second cell transistor CT2 and the second memory cell 202. The second word line WL1 may be coupled to third and fourth memory cells 203 and 204. The intersection between the second word line WL1 and the first bit line BL0 may be coupled to a third cell transistor CT3 and the third memory cell 203. The intersection between the second word line WL1 and the second 25 bit line BL1 may be coupled to a fourth cell transistor CT4 and the fourth memory cell 204. The third word line WL2 may be coupled to fifth and sixth memory cells 205 and 206. The intersection between the third word line WL2 and the first bit line BL0 may be coupled to a fifth cell transistor CT5 and the fifth memory cell 205. The intersection between the third word line WL2 and the second bit line BL1 may be coupled to a sixth cell transistor CT6 and the sixth memory cell 206. The fourth word line WL3 may be coupled to a seventh memory cell 207. The intersection between the fourth word line WL3 and the first bit line BL0 may be coupled to a seventh cell transistor CT7 and the seventh memory cell 207.

For example, it is assumed that data with a high level (hereinafter data 1) is stored in the second and fifth memory cells 202 and 205. In the first operation mode, the word line drivers 110 and 120 may precharge the first and third word lines WL0 and WL2 corresponding to the odd word lines and the second word line WL1 corresponding to the odd word line to the first low voltage VBBW0. At this time, passing GIDL may occur from the memory cell storing the data 1 toward the word lines precharged to the low voltage level. In particular, the passing GIDL may flow to a word line which is not formed in the same active region, as described below.

In the second operation mode, the word line drivers 110 and 120 may precharge the first and third word lines WL0 and WL2 corresponding to the odd word lines to the first low voltage VBBW0, and precharge the second word line WL1 corresponding to the odd word line to the second low voltage VBBW1. The second word line WL1 may be precharged to a lower level than the first and third word lines WL0 and WL2. The passing GIDL from the second and fifth memory cells 202 and 205 may flow toward the second word line WL1. At this time, since the second word line WL1 is precharged to the level of the second low voltage VBBW1 lower than the first low voltage VBBW0, higher passing GIDL may occur. Thus, a memory cell susceptible to GIDL may lose the data 1 stored therein, due to passing GIDL.

Figure 3:
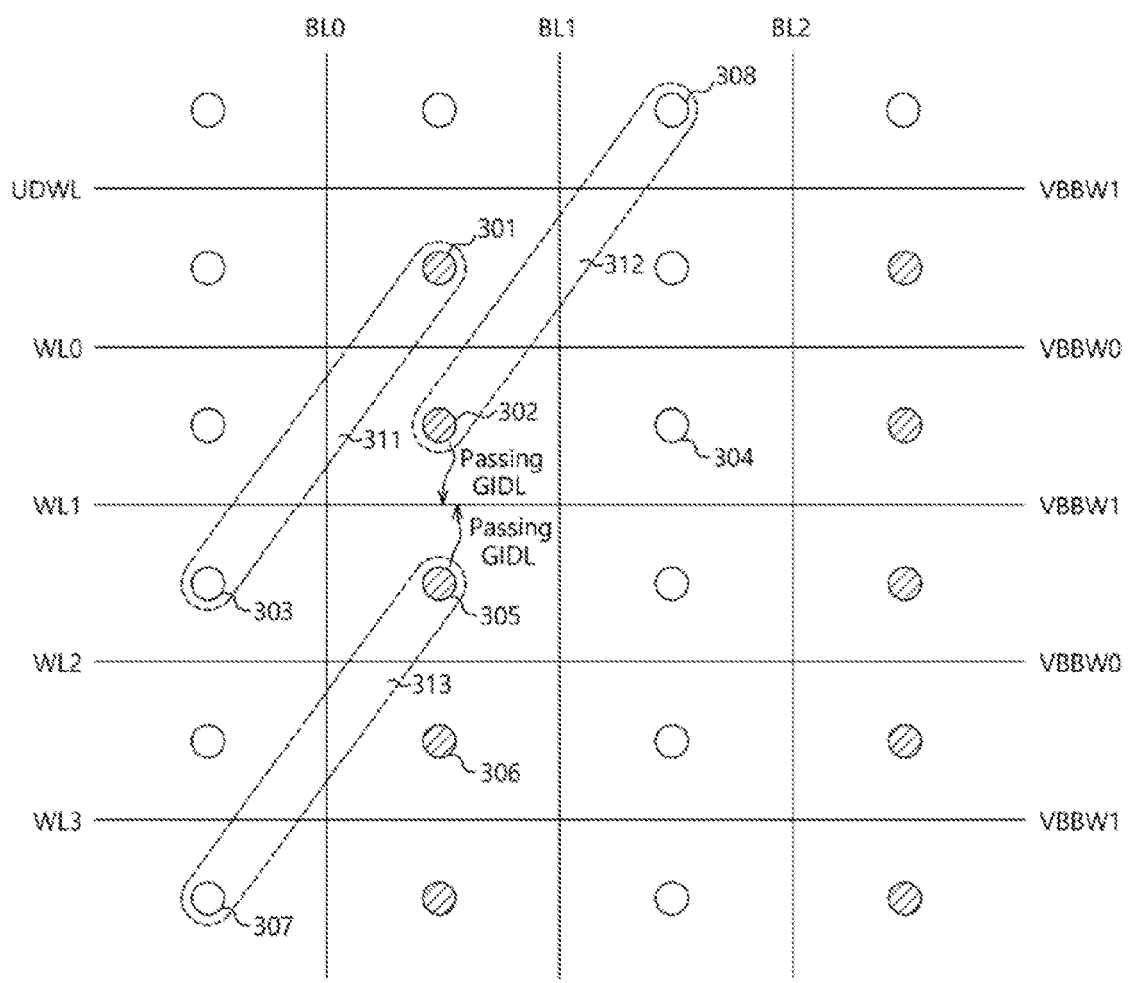
FIG. 3 and FIG. 4 are schematic diagrams illustrating a structure of a memory cell array, according to an embodiment of the present disclosure.
Figure 4:
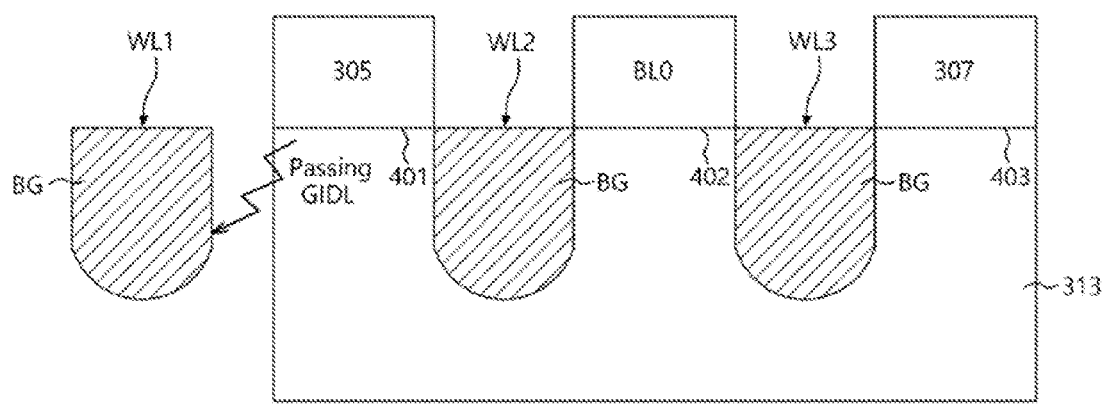

FIG. 3 and FIG. 4 are plan and cross-sectional views, respectively, of a memory cell array according to an embodiment of the present disclosure, respectively. For example, the memory cell array of FIGS. 3 and 4 may be the memory cell array 11 of FIG. 1.

Referring to FIG. 3, the memory cell array may include the up dummy word line UDWL, the first to fourth word lines WL0 to WL3, and the first to third bit lines BL0 to BL2. The memory cells coupled to the respective intersections between the word lines UDWL and WL0 to WL3 and the bit lines BL0 to BL2 are represented by circles. The memory cell array may have a structure in which memory cells arranged on a diagonal line are formed in a shared active region, in order to reduce the area. For example, the first and third memory cells 301 and 303 may be formed over a first active region 311, and the second memory cell 302 and the dummy memory cell 308 may be formed over a second active region 312. The fifth and seventh memory cells 305 and 307 may be formed over a third active region 313.

Referring to FIG. 4, the third and fourth word lines WL2 and WL3 having a buried gate BG may be formed in the third active region 313. The buried gate BG of the second word line WL1 may be formed adjacent to the third active region 313. Although not illustrated, the space between the third active region 313 and the second word line WL1 may be filled with an oxide material. The fifth memory cell 305 may be formed over a first region 401 of the third active region 313, the first bit line BL0 may be formed over a second region 402 of the third active region 313, and the seventh memory cell 307 may be formed over a third region 403 of the third active region 313. When the third word line WL2 is precharged to the level of the first low voltage VBBW0 and the second word line WL1 is precharged to the level of the second low voltage VBBW1, passing GIDL may occur from the memory cell 305 to the second word line WL1.

Referring back to FIG. 3, data 1 may be stored in the memory cells coupled to the first and third word lines WL0 and WL2 corresponding to even word lines. Also data with a low level (hereinafter data 0) may be formed in the memory cells coupled to the second word line WL1 corresponding to the odd word line, in order to screen memory cells susceptible to GIDL. In FIG. 3, a memory cell storing the data 1 is represented by a painted circle, and a memory cell storing the data 0 is represented by an unpainted circle. After the corresponding data are stored, the word line drivers 110 and 120 may precharge the odd word lines WL0 and WL2 to the first low voltage VBBW0, and precharge the odd word lines WL1 and WL3 to the second low voltage VBBW1. When the second and fifth memory cells 302 and 305 are susceptible to GIDL, passing GIDL may flow from the second and fifth memory cells 302 and 305 to the second word line WL1 precharged to a lower voltage level. The passing GIDL may be accelerated as the voltage level to which the second word line WL1 is precharged is low. Thus, the word line drivers 110 and 120 can build an environment in which the word lines can be precharged in the direction where the passing GIDL is accelerated, and memory cells susceptible to the passing GIDL can be easily screened.

Figure 5:
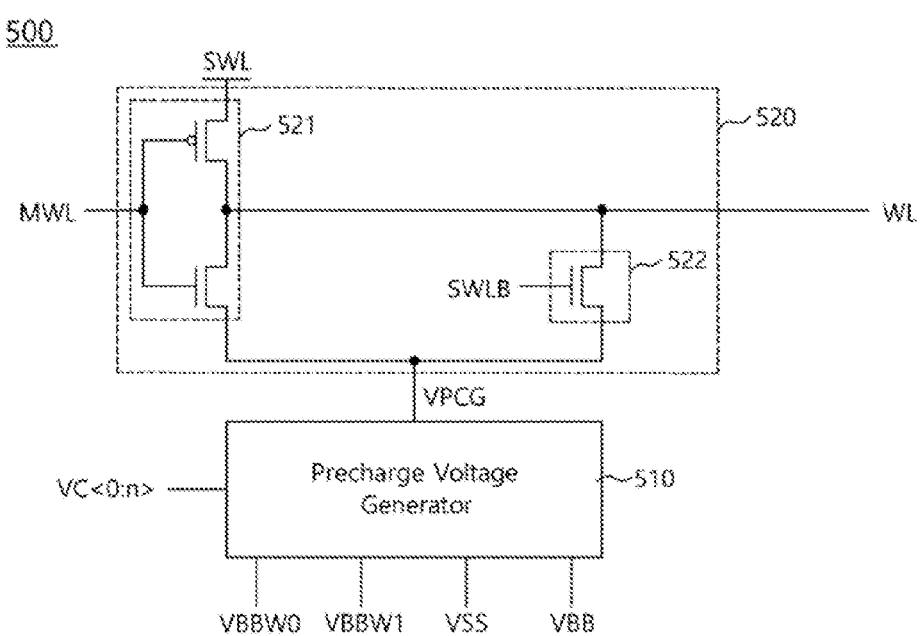
FIG. 5 is a diagram illustrating a word line driver, according to an embodiment of the present disclosure.

Referring to FIG. 5 a word line driver 500 is provided, according to an embodiment of the present disclosure. For example, the word line driver 500 of FIG. 5 may be one of the word line drivers 110 to 140 of FIG. 1.

The word line driver 500 may include a precharge voltage generator 510 and a sub word line driver 520. The precharge voltage generator 510 may output the first and/or second low voltages VBBW0 and VBBW1 as a precharge voltage VPCG in response to a voltage control signal VC<0:n>. The voltage control signal VC<0:n> may be generated based on an address signal and the operation mode of the semiconductor memory apparatus 1 of FIG. 1. Thus, the voltage control signal VC<0:n> may be changed according to whether the operation mode of the semiconductor memory apparatus is the first or second operation mode, and changed to select a precharge voltage which is applied to an odd or even word line.

The precharge voltage generator 510 may additionally output third and fourth low voltages VSS and VBB as the precharge voltage VPCG in response to the voltage control signal VC<0:n>. The third low voltage VSS may be higher than the first low voltage VBBW0, and the fourth low voltage VBB may be lower than the second low voltage VBBW1. The precharge voltage generator 510 may output the third low voltage VSS in place of the first low voltage VBBW0 as the precharge voltage VPCG in response to the voltage control signal VC<0:n>, and output the fourth low voltage VBB in place of the second low voltage VBBW1 as the precharge voltage VPCG. When the third and fourth low voltages VSS and VBB are provided as the precharge voltages, a voltage difference between an odd word line and an even word line may be further increased, and s1 the passing GIDL occurring from the memory cell may also be further increased.

The sub word line driver 520 may include a configuration for enabling at least one word line WL. It is noted that the word line driver 500 may include a plurality of sub word line drivers coupled to the plurality of word lines, respectively. The sub word line driver 520 may include a word line enable unit 521 and a precharge unit 522. The word line enable unit 521 may enable or precharge the word line WL coupled to the sub word line driver 520 in response to a word line select signal. The word line select signal may include a main word line select signal MWL and a sub word line select signal SWL. The main word line select signal MWL and the sub word line select signal SWL may be generated based on the address signal. For example, when the main word line select signal MWL is enabled, the word line enable unit 521 may enable the word line WL to a voltage level corresponding to the sub word line select signal SWL. Furthermore, when the main word line select signal MWL is disabled, the word line enable unit 521 may precharge the word line WL to a voltage level corresponding to the precharge voltage VPCG.

The precharge unit 522 may precharge the word line WL in response to the inverted signal SWLB of the sub word line select signal SWL. When the sub word line select signal SWL is disabled according to the address signal and thus the signal SWLB is enabled, the word line precharge unit 522 may precharge the word line WL to a voltage level corresponding to the precharge voltage VPCG.

Figure 6:
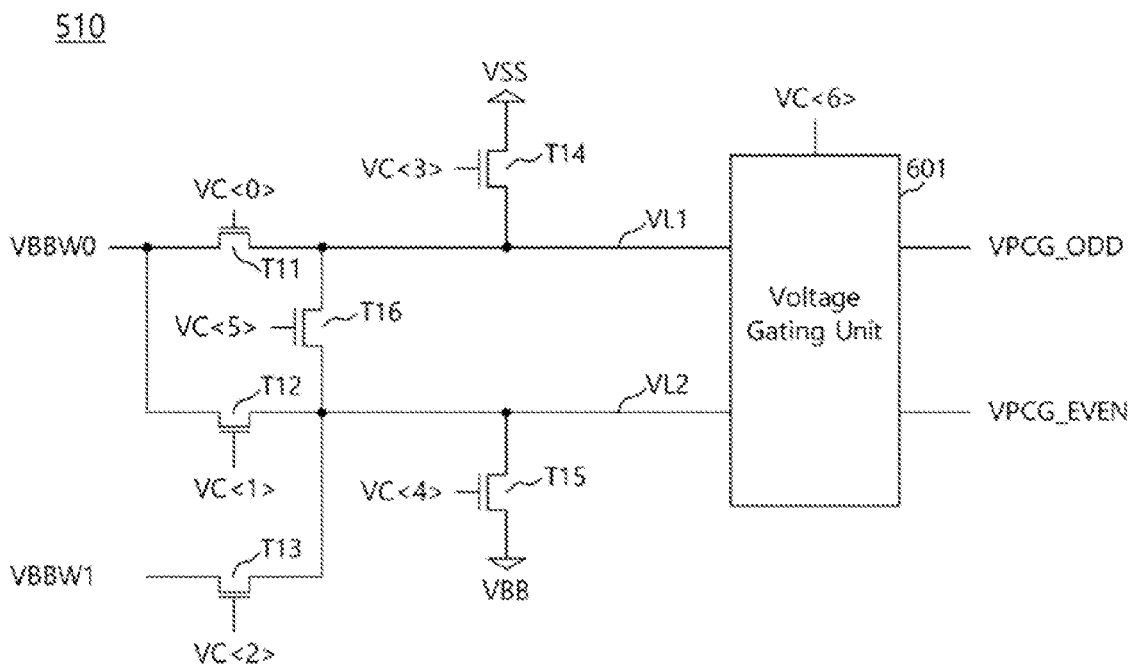
FIG. 6 is a diagram illustrating a precharge voltage generator, according to an embodiment of the present disclosure.

Referring now to FIG. 6 a precharge voltage generator is provided, according to an embodiment of the present disclosure. For example, the precharge voltage generator of FIG. 6 may be the precharge voltage generator 510 of FIG. 5.

The precharge voltage generator 510 may include first to sixth transistors T11 to T16 and a voltage gating unit 601.

The first transistor T11 may receive the first voltage control signal VC<0> through the gate thereof. Either the source or the drain of the first transistor T11 may receive the first low voltage VBBW0, and the other may be coupled to a first voltage line VL1. The second transistor T12 may receive the second voltage control signal VC<1> through the gate thereof. Either the source or the drain of the second transistor T12 may receive the first low voltage VBBW0, and the other may be coupled to a second voltage line VL2. The third transistor T13 may receive the third voltage control signal VC<2> through the gate thereof. Either the source or the drain of the third transistor T13 may receive the second low voltage VBBW1, and the other may be coupled to the second voltage line VL2. The fourth transistor T14 may receive the fourth voltage control signal VC<3> through the gate thereof. Either the source or the drain of the fourth transistor T14 may receive the third low voltage VSS, and the other may be coupled to the first voltage line VL1. The fifth transistor T15 may receive the fifth voltage control signal VC<4> through the gate thereof. Either the source or the drain of the fifth transistor T15 may receive the fourth low voltage VBB, and the other may be coupled to the second voltage line VL2. The sixth transistor T16 may receive the sixth voltage control signal VC<5> through the gate thereof, and the source and drain of the sixth transistor T16 may be coupled to the first and second voltage lines VL1 and VL2, respectively.

The voltage gating unit 601 may provide the voltages of the first and second voltage lines VL1 and VL2 as the precharge voltage VPCG_ODD for the odd word lines and the precharge voltage VPCG_EVEN for the even word lines, respectively, in response to the seventh voltage control signal VC<6>. For example, when the seventh voltage control signal VC<6> is enabled, the voltage gating unit 601 may couple the first voltage line VL1 to a sub word line driver coupled to an odd word line, such that the voltage of the first voltage line VL1 is provided as the precharge voltage VPCG_ODD. Furthermore, the voltage gating unit 601 may couple the second voltage line VL2 to a sub word line driver coupled to an even word line, such that the voltage of the second voltage line VL2 is provided as the precharge voltage VPCG_EVEN. When the seventh voltage control signal VC<6> is disabled, the voltage gating unit 601 may couple the first voltage line VL1 to the sub word line driver coupled to the odd word line, such that the voltage of the first voltage line VL1 is provided as the precharge voltage VPCG_ODD. Furthermore, the voltage gating unit 601 may couple the second voltage line VL2 to the sub word line driver coupled to the even word line, such that the voltage of the second voltage line VL2 is provided as the precharge voltage VPCG_EVEN.

In the first operation mode, the first, second, and sixth voltage control signals VC<0>, VC<1>, and VC<5> may be enabled, and the third to fifth voltage control signals VC<2>, VC<3>, and VC<4> may be disabled. Thus, the first and second voltage lines VL1 and VL2 may be set to the level of the first low voltage VBBW0. Thus, the precharge voltages VPCG_ODD and VPCG_EVEN may have the level of the first low voltage VBBW0, and the odd word line and the even word line may be precharged to the level of the first low voltage VBBW0.

In the second operation mode, the first and third voltage control signals VC<0> and VC<2> may be enabled, and the second, fourth, fifth, and sixth voltage control signals VC<1>, VC<3>, VC<4>, and VC<5> may be disabled. Thus, the first voltage line VL1 may be set to the level of the first low voltage VBBW0, and the second voltage line VL2 may be set to the level of the second low voltage level VBBW1. When the seventh voltage control signal VC<6> is enabled, the precharge voltage VPCG_EVEN may have the level of the first low voltage VBBW0, and the precharge voltage VPCG_ODD may have the level of the second low voltage VBBW1. Thus, an even word line may be precharged to the level of the first low voltage VBBW0, and an odd word line may be precharged to the level of the second low voltage VBBW1. When the seventh voltage control signal VC<6> is disabled, the precharge voltage VPCG_EVEN may have the level of the second low voltage VBBW1, and the precharge voltage VPCG_ODD may have the level of the first low voltage VBBW0. Thus, the even word line may be precharged to the level of the second low voltage VBBW1, and the odd word line may be precharged to the level of the first low voltage VBBW0.

In the second operation mode, the fourth and fifth voltage control signals VC<3> and VC<4> may be enabled instead of the first and third voltage control signals VC<0> and VC<2>. Thus, the first voltage line VL1 may be set to the level of the third low voltage VSS, and the second voltage line VL2 may be set to the level of the fourth low voltage level VBB. Thus, the even word line may be precharged to one of the third and fourth low voltages VSS and VBB, and the odd word line may be precharged to one of the fourth and third low voltages VBB and VSS.

Figure 7:
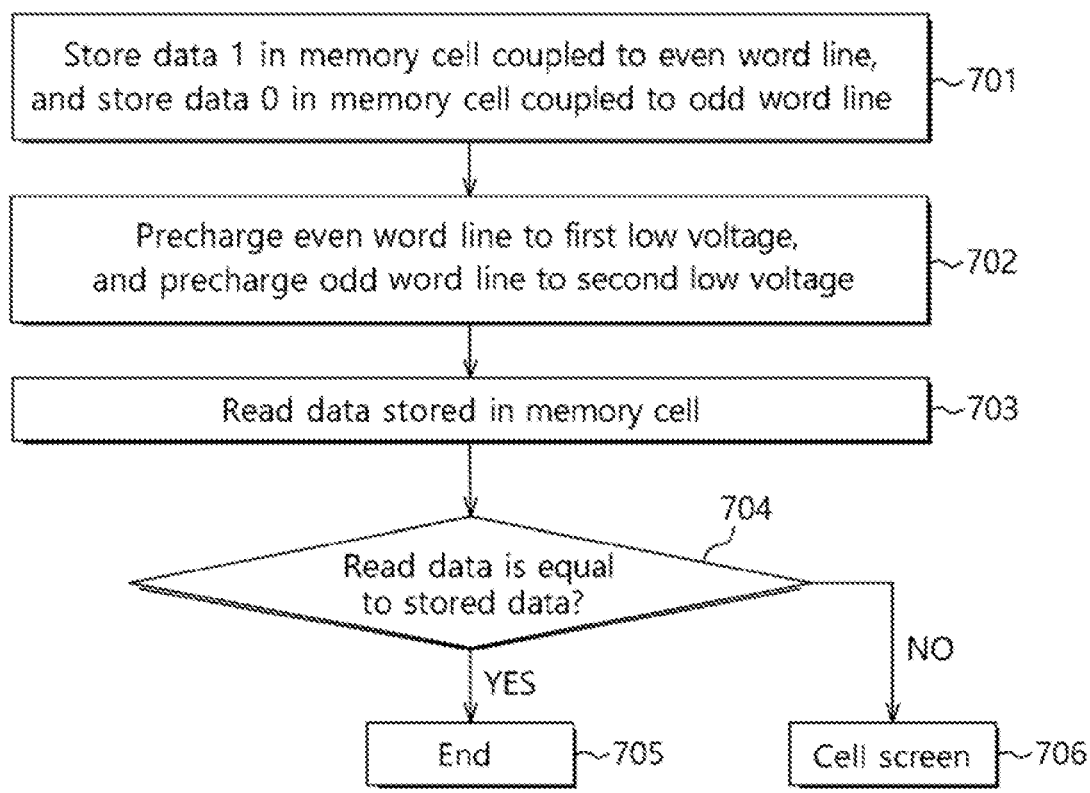
FIG. 7 is a flowchart illustrating a test method of a semiconductor memory apparatus, according to an embodiment of the present disclosure.

FIG. 7 is a flowchart illustrating a test method of a semiconductor memory apparatus according to an embodiment of the present disclosure. For example, the test method of FIG. 7 may be performed by the semiconductor memory apparatus 1 of FIG. 1.

Referring to FIGS. 1 to 7, the test method and the operation of the semiconductor memory apparatus according to the embodiment of the present disclosure will be described as follows. First, the semiconductor memory apparatus 1 may operate in the second operation mode, in order to screen memory cells susceptible to GIDL. The semiconductor memory apparatus 1 may store data 1 in memory cells coupled to the even word lines WL0 and WL2, and store data 0 in memory cells coupled to the odd word lines WL1 and WL3, at step 701.

Then, the semiconductor memory apparatus 1 may precharge the even word lines WL0 and WL2 to the first low voltage VBBW0, and precharge the odd word lines WL1 and WL3 to the second low voltage VBBW1, at step 702. Since the odd word lines WL1 and WL3 are precharged to a lower voltage level than the even word lines WL0 and WL2, a current from a memory cell susceptible to GIDL among the memory cells storing the data 1 may flow to the odd word lines WL1 and WL3. At this time, some memory cells among the memory cells storing the data 1 may lose the data stored therein, due to GIDL.

Then, the semiconductor memory apparatus 1 may read data stored in a memory cell at step 703. The semiconductor memory apparatus 1 may determine whether the data read from the memory cell is equal to the data stored in the memory cell, at step 704. When the data read from the memory cells coupled to the even word lines WL0 and WL2 are equal to the data stored in the memory cells or equal to 1, the semiconductor memory apparatus 1 may determine that the memory cells are normal memory cells, at step 705. On the other hand, when the data read from the memory cells coupled to the even word lines WL0 and WL2 are different from the data stored in the memory cells or different from 1, the semiconductor memory apparatus 1 may determine that the memory cells lost the data stored therein due to GIDL and are abnormal memory cells, at step 706.

Such a process may be repeated through the process of storing the data 0 in the memory cells coupled to the even word lines WL0 and WL2, storing the data 1 in the memory cells coupled to the odd word line WL1, precharging the even word lines WL0 and WL2 to the second low voltage VBBW1, and precharging the odd word lines WL1 and WL3 to the first low voltage VBBW1. As such, the semiconductor memory apparatus according to an embodiment of the present disclosure may efficiently screen memory cells susceptible to GIDL at the wafer level, thus making it possible not only to reduce fabrication cost but also to improve the reliability of the semiconductor memory apparatus.

While certain embodiments have been described above, it will be understood to those skilled in the art that the embodiments described are by way of example only. Accordingly, the invention as described herein should not be limited to the described embodiments. Various other embodiments may be envisaged by those skilled in this art after having read the present disclosure without departing from the spirit and scope of the invention as defined by the appended claims.

What is claimed is:

1. A word line driver comprising:
    a precharge voltage generator suitable for providing one of a first low voltage, a second low voltage, a third low voltage and a fourth low voltages as a precharge voltage, based on a voltage control signal; and
    a sub word line driver suitable for precharging a word line to the precharge voltage based on a word line select signal.

2. The word line driver according to claim 1, wherein the second low voltage has a lower level than the first low voltage.

3. The word line driver according to claim 1, wherein the sub word line driver comprises:
    a word line enable unit suitable for enabling the word line to a voltage level corresponding to a sub word line select signal in response to a main word line select signal or precharge the word line to the level of the precharge voltage; and
    a precharge unit suitable for precharging the word line to the level of the precharge voltage in response to the sub word line select signal.

4. The word line driver according to claim 3, wherein the precharge unit is suitable for precharging the first word line to the level of the precharge voltage in response to an inverted signal of the sub word line select signal.

5. The word line driver according to claim 1, wherein the third low voltage has a higher level than the first low voltage, and the fourth low voltage has a lower level than the second low voltage.

6. A semiconductor memory apparatus comprising:
    a memory cell array comprising an odd word line and an even word line which are alternately arranged; and
    a word line driver suitable for precharging the odd word line to one of a first low voltage and a second low voltages, and precharging the even word line to one of the first low voltage and second low voltages, according to operation modes.

7. The semiconductor memory apparatus according to claim 6, wherein the second low voltage has a lower level than the first low voltage.

8. The semiconductor memory apparatus according to claim 6, wherein the word line driver precharges the odd word line and the even word line to third and fourth low voltages, respectively, and wherein the third low voltage has a higher level than the first low voltage, and the fourth low voltage has a lower level than the second low voltage.

9. The semiconductor memory apparatus according to claim 6, further comprising:
    a sub word line driver suitable for enabling and/or disabling the odd word line and the even word line in response to a word line select signal; and
    a precharge voltage generator suitable for providing one of the first and second low voltages to a sub word line driver coupled to the even word line in response to a voltage select signal, and providing one of the first and second low voltages to a sub word line driver coupled to the odd word line.

10. The semiconductor memory apparatus according to claim 9, wherein the precharge voltage generator provides the first low voltage to the sub word line driver coupled to the even word line and the sub word line driver coupled to the odd word line in a first operation mode.

11. The semiconductor memory apparatus according to claim 10, wherein the precharge voltage generator provides the first low voltage to the sub word line driver coupled to the even word line, and provides the second low voltage to the sub word line driver coupled to the odd word line, in a second operation mode.

12. The semiconductor memory apparatus according to claim 11, wherein the memory cell array further comprises an up dummy word line arranged at the top thereof and a down dummy word line arranged at the bottom thereof; and
    the word line driver precharges the up dummy word line to one of the first and second low voltages, and the down dummy word line to the other of the first and second low voltages.

13. The semiconductor memory apparatus according to claim 12, wherein the word line driver precharges the up dummy word line and the down dummy word line to the first low voltage in the first operation mode.

14. The semiconductor memory apparatus according to claim 13, wherein the word line driver precharges the up dummy word line to the second low voltage level and the down dummy word line to the first low voltage level, in the second operation mode.

15. A test method for a semiconductor memory apparatus for screening memory cells subject to GIDL, the test method comprising:
    storing first data in a memory cell coupled to an even word line, and second data in a memory cell coupled to an odd word line; and
    precharging an even word line to a first low voltage, and an odd word line to a second low voltage being different from the first low voltage.

16. The test method according to claim 15, wherein the second low voltage has a lower level than the first low voltage.

17. The test method according to claim 15, further comprising:
    determining whether data read from the memory cell coupled to the odd word line is the first data; and
    screening the memory cell coupled to the odd word line according to the determination result.

18. The test method according to claim 15, wherein in a normal operation mode, the odd and the even word lines are precharged to the first low voltage.

19. The test method according to claim 15, further comprising: precharging the even word line to a third low voltage, and the odd word line to a fourth low voltage.

20. The test method according to claim 19, wherein the third low voltage has a higher level than the first low voltage, and the fourth low voltage has a lower level than the second low voltage.

* * * * *